United States Patent
Shinagawa et al.

(10) Patent No.: US 10,782,321 B2
(45) Date of Patent: Sep. 22, 2020

(54) EXCITATION CORE, SENSOR HEAD, AND CURRENT SENSOR

(71) Applicants: YOKOGAWA ELECTRIC CORPORATION, Musashino-shi, Tokyo (JP); Yokogawa Test & Measurement Corporation, Musashino-shi, Tokyo (JP)

(72) Inventors: Takanobu Shinagawa, Tokyo (JP); Kiyoshi Yokoshima, Tokyo (JP)

(73) Assignees: Yokogawa Electric Corporation, Musashino-shi, Tokyo (JP); YOKOGAWA TEST & MEASUREMENT CORPORATION, Musashino-shi, Tokyo (JP)

( * ) Notice: Subject to any disclaimer, the term of this patent is extended or adjusted under 35 U.S.C. 154(b) by 221 days.

(21) Appl. No.: 15/923,636

(22) Filed: Mar. 16, 2018

(65) Prior Publication Data

US 2018/0284161 A1    Oct. 4, 2018

(30) Foreign Application Priority Data

Mar. 28, 2017 (JP) ................................. 2017-062077

(51) Int. Cl.
*G01R 15/18* (2006.01)

(52) U.S. Cl.
CPC .................................. *G01R 15/186* (2013.01)

(58) Field of Classification Search
None
See application file for complete search history.

(56) References Cited

U.S. PATENT DOCUMENTS

| | | | | |
|---|---|---|---|---|
| 5,488,304 | A * | 1/1996 | Hamade | G01R 1/22 324/520 |
| 7,230,413 | B2 * | 6/2007 | Zhang | G01R 15/181 324/117 R |
| 9,007,077 | B2 * | 4/2015 | El-Essawy | G01R 15/207 324/117 H |
| 9,423,469 | B2 * | 8/2016 | Gudel | G01R 15/185 |
| 10,122,295 | B2 * | 11/2018 | Wang | H02M 3/3384 |
| 10,345,341 | B2 * | 7/2019 | Shinagawa | G01R 15/18 |
| 2013/0154629 | A1 * | 6/2013 | Gudel | G01R 15/185 324/225 |
| 2015/0062927 | A1 * | 3/2015 | Hirakata | G09F 9/301 362/362 |

FOREIGN PATENT DOCUMENTS

| | | |
|---|---|---|
| JP | 2005-134233 A | 5/2005 |
| JP | 2007-057294 A | 3/2007 |
| JP | 2012-68187 A | 4/2012 |
| JP | 2013-539538 A | 10/2013 |

* cited by examiner

*Primary Examiner* — Paresh Patel
(74) *Attorney, Agent, or Firm* — Sughrue Mion, PLLC

(57) ABSTRACT

An excitation core includes an annular strip-shaped magnetic substance, in which both ends of the strip-shaped magnetic substance are overlapped in a thickness direction and are in contact with one another. A sensor head includes: this excitation core and a magnetism collecting body. The magnetism collecting body includes a strip-shaped first magnetism collector and a strip-shaped second magnetism collector, the first magnetism collector having both ends thereof in contact with both ends of the second magnetism collector to form the annular magnetism collecting body, the magnetism collecting body being disposed on an inside or an outside of the reinforcing body.

14 Claims, 11 Drawing Sheets

EXCITATION CORE, SENSOR HEAD, AND CURRENT SENSOR

CROSS-REFERENCE TO RELATED APPLICATION

This application claims priority from Japanese Patent Application No. 2017-062077 filed with the Japan Patent Office on Mar. 28, 2017, the entire content of which is hereby incorporated by reference.

BACKGROUND

1. Technical Field

The present disclosure relates to an excitation core, a sensor head, and a current sensor.

2. Description of the Related Art

As a current sensor, for example, there has been known a penetration-type contactless current sensor disclosed in JP-A-2007-057294. The current sensor disclosed in JP-A-2007-057294 causes a measurement target to penetrate an annular excitation core. Measuring a current or a voltage of an excitation coil wound around the excitation core measures a current flowing through the measurement target.

There has been known a flux gate type current detection method as a current measurement method. This method obtains a current signal from a current or a voltage of an excitation coil. Furthermore, a zero-flux method has also been known. This method causes the above-described current to flow through a feedback coil wound around an outside of an excitation coil. The method obtains the current signal from the current flowing through the feedback coil.

As the above-described excitation core, the use of a thin strip-shaped magnetic substance like an amorphous is considered to improve the performance and achieve the cost reduction. In such case, the following method is typically employed. By winding the thin strip-shaped magnetic substance by several times, the thin strip-shaped magnetic substance is stacked into several layers. Thus, the excitation core is created.

SUMMARY

An excitation core includes an annular strip-shaped magnetic substance. Both ends of the strip-shaped magnetic substance are overlapped in a thickness direction and are in contact with one another.

DESCRIPTION OF THE EMBODIMENTS

Figure 1:
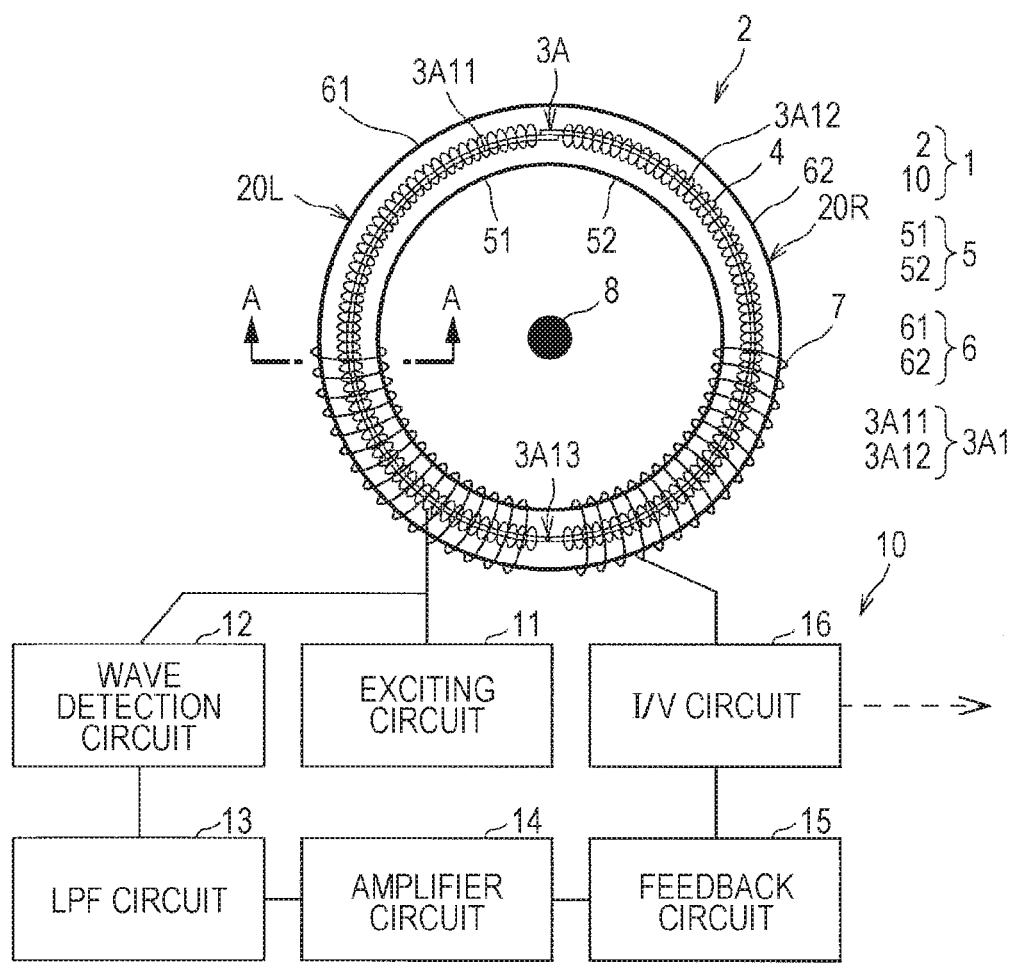
FIG. 1 is a block diagram illustrating a contactless type current sensor according to a first embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It is difficult to employ a conventional excitation core to a divided clamp-type contactless current sensor. Because the excitation core constituted of a thin strip-shaped magnetic substance loses performance as the excitation core through the division. The first factor is mechanical strength. A cross-sectional surface of the divided excitation core obtained by winding the thin strip-shaped magnetic substance is made of thin strip-shaped magnetic substances stacked in several layers. Moreover, the cross-sectional surface of each layer has a linear shape. Therefore, when this excitation core is employed to the divided clamp-type contactless current sensor, the mechanical strength of the thin strip-shaped magnetic substance cannot bear opening and closing operations, thereby immediately causing a contact failure.

The second factor is reproducibility of a current measurement value. As described above, only the linear-shaped magnetic substances by the several layers are present on the cross-sectional surfaces of the divided excitation cores. In view of this, in the opening and the closing operations of clamp parts of the divided clamp-type contactless current sensor using this, a contact between the magnetic substances at both cross-sectional surface parts actually becomes a line contact. This means small contacted areas between the magnetic substances. In such case, the reproducibility of magnetic coupling at the contact parts in association with the opening and the closing of the clamp parts is less likely to be obtained. Consequently, obtaining the reproducibility of the current measurement value is difficult.

Due to such circumstances, the use of the thin strip-shaped magnetic substance to the excitation core structure of the divided clamp-type contactless current sensor is difficult.

One object of the present disclosure is to provide an excitation core, a sensor head, and a current sensor that can employ a thin strip-shaped magnetic substance as a divided clamp-type excitation core.

An excitation core according to an aspect of the present disclosure (the present excitation core) includes an annular strip-shaped magnetic substance. Both ends of the strip-shaped magnetic substance are overlapped in a thickness direction and are in contact with one another.

Further, this excitation core may further include an annular reinforcing body made of a non-magnetic material and having both ends overlapped in the thickness direction and in contact with one another, the both ends of the reinforcing body may be contactable/separable, and the strip-shaped magnetic substance may be disposed on the reinforcing body.

Further, the reinforcing body may have a through-hole, and the strip-shaped magnetic substance may be caused to pass through the through-hole, and one end of the strip-shaped magnetic substance may be positioned on an outer surface of one end of the reinforcing body and the other end of the strip-shaped magnetic substance may be positioned on an inner surface of the other end of the reinforcing body.

Further, the reinforcing body may have a stepped portion, the other end side of the reinforcing body from the stepped portion may project annularly outward from the one end side of the reinforcing body from the stepped portion, and the through-hole may be formed in the stepped portion.

Further, the reinforcing body may include a first reinforcing member and a second reinforcing member as separate components, a hinge including a shaft and allowing the first reinforcing member and the second reinforcing member to be swingable around the shaft may be disposed in one end of the first reinforcing member and one end of the second reinforcing member, and the other end of the first reinforcing member and the other end of the second reinforcing member may be overlapped in the thickness direction.

Further, the strip-shaped magnetic substance may be disposed on an outside of the hinge.

Further, the shaft of the hinge may be disposed between an outer surface and an inner surface of the reinforcing body.

A sensor head according to an aspect of the present disclosure includes: the above-described excitation core; and a magnetism collecting body including a strip-shaped first magnetism collector and a strip-shaped second magnetism collector, the first magnetism collector having both ends thereof in contact with both ends of the second magnetism collector to form the annular magnetism collecting body, the magnetism collecting body being disposed on an inside or an outside of the reinforcing body.

A current sensor according to an aspect of the present disclosure includes: the above-described excitation core; and a current detector configured to detect a current flowing through a measurement target penetrating the excitation core.

According to this excitation core, both ends of the strip-shaped magnetic substance are overlapped in the thickness direction and are in contact with one another. This ensures maintaining sufficient contacted areas in opening and closing operations of the strip-shaped magnetic substance. This allows the thin strip-shaped magnetic substance to be used as the clamp-type excitation core.

First Embodiment

The following describes a contactless type current sensor according to the present embodiment with reference to the drawings. To avoid a complicated drawing, in FIG. 1, a feedback coil 7 is wound around only a part of cores 20L and 20R. Actually, the feedback coil 7 is typically wound around the whole cores 20L and 20R along the circumferential direction.

Figure 2:
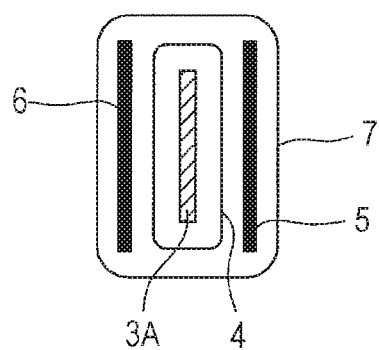
FIG. 2 is a schematic cross-sectional view of a sensor head in FIG. 1 taken along line A-A.

A current sensor 1 includes a sensor head 2 and a current detecting circuit 10 as a current detector. As illustrated in FIGS. 1 and 2 and the like, the sensor head 2 includes an annular excitation core 3A, an excitation coil 4 wound around the excitation core 3A, an inner magnetism collecting body 5 serving as a magnetism collecting body, an outer magnetism collecting body 6 serving as a magnetism collecting body, a case (not illustrated), and the feedback coil 7 wound around the case (not illustrated). The inner magnetism collecting body 5 is a magnetism collecting body disposed on an inside of the excitation core 3A. The outer magnetism collecting body 6 is disposed on an outside of the excitation core 3A. The case (not illustrated) houses these excitation core 3A, excitation coil 4, inner magnetism collecting body 5, and outer magnetism collecting body 6. A measurement target 8 such as an electric wire is caused to pass through the center of the excitation core 3A.

The current detecting circuit 10, for example, detects a current flowing through the measurement target 8 penetrated in the excitation core 3A. The current detecting circuit 10 includes an exciting circuit 11, a wave detection circuit 12, an LPF circuit 13, an amplifier circuit 14, a feedback circuit 15, and an I/V circuit 16. The excitation coil 4 is coupled to the exciting circuit 11 and is alternatively excited by an alternating exciting current. An exciting voltage or an exciting current of the excitation coil 4 changes by an action of a current flowing through the measurement target 8 (hereinafter referred to as a measured current). The wave detection circuit 12 detects the change in the exciting voltage or the exciting current of the excitation coil 4 and generates a signal according to the detection result. Passing this signal through the LPF circuit 13 obtains the signal proportional to the measured current.

Subsequently, when this signal is amplified by the amplifier circuit 14 and goes through the feedback circuit 15, a current flowing through the feedback coil 7 is generated. The current flowing through the feedback coil 7 generates a magnetic field in the feedback coil 7. Consequently, a magnetic flux is generated in the excitation core 3A, the inner magnetism collecting body 5, and the outer magnetism collecting body 6. A direction of the wound wire on the feedback coil 7 is a direction in which the magnetic flux generated by the current flowing through the feedback coil 7 acts so as to cancel the magnetic flux generated by the measured current. Therefore, with this configuration, the magnetic flux at the excitation core 3A, the inner magnetism collecting body 5, and the outer magnetism collecting body 6 in the feedback coil 7 is reduced to almost zero. The current flowing through the feedback coil 7 is proportionate to the measured current. In view of this, performing a current-voltage conversion on the current flowing through the feedback coil 7 by using the I/V circuit 16 obtains an output voltage serving as a final estimated value of the measured current.

The following describes a configuration of the above-described excitation core 3A with reference to FIGS. 3 to 6. The excitation core 3A includes a reinforcing body 3A1 and a strip-shaped magnetic substance 3A2. The reinforcing body 3A1 includes a first reinforcing member 3A11 and a second reinforcing member 3A12 as separate components. The first reinforcing member 3A11 and the second reinforcing member 3A12 are, for example, made of a strip-shaped non-magnetic material (such as plastic). Overlapping both ends of the first reinforcing member 3A11 and the second reinforcing member 3A12 with one another in a thickness direction and bringing the both ends thereof into contact with one another forms the circular annular reinforcing body 3A1. The first reinforcing member 3A11 and the second reinforcing member 3A12 are each formed into a substantially U shape along a semicircle. A hinge 3A13 is disposed in one end T11 of the first reinforcing member 3A11 and one end T21 of the second reinforcing member 3A12 (a connection portion between the one end T11 and the one end T21).

Figure 6:
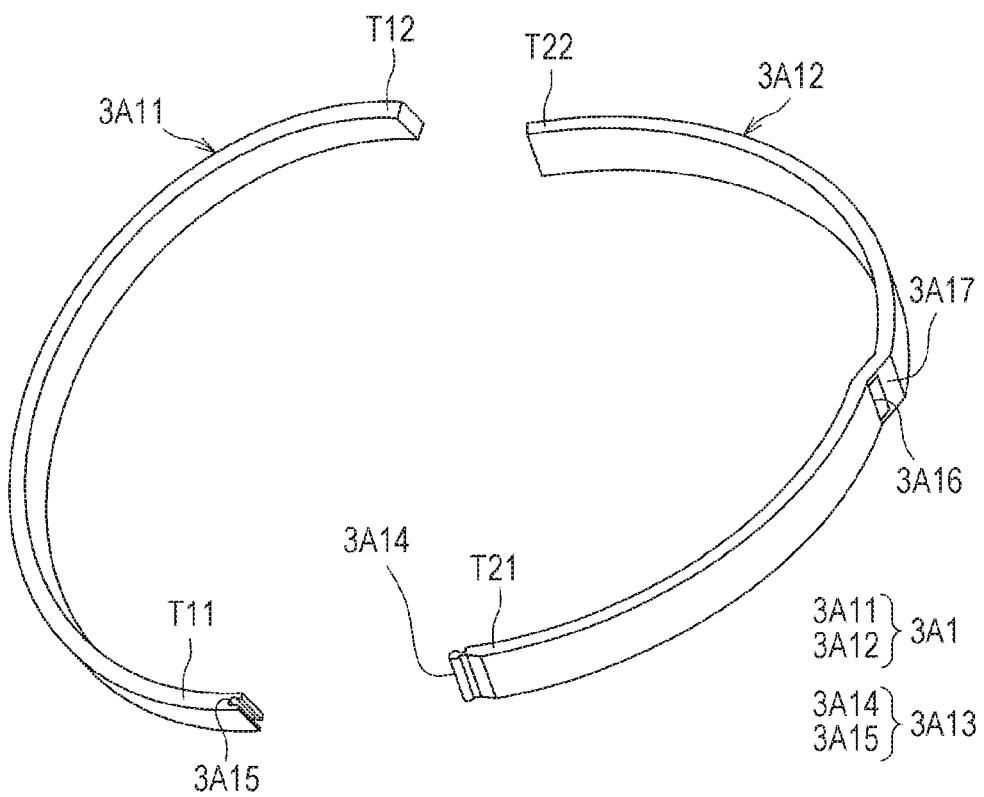
FIG. 6 is an exploded perspective view of a reinforcing body illustrated in FIGS. 3 to 5.

As illustrated in FIG. 6, the hinge 3A13 includes a shaft 3A14 disposed in the one end T21 of the second reinforcing member 3A12 and a bearing 3A15 disposed in the one end T11 of the first reinforcing member 3A11. The shaft 3A14 is formed into a substantially cylindrical shape. The shaft 3A14 is disposed to project on an end surface of the one end T21 of the second reinforcing member 3A12 so that a shaft direction of the shaft 3A14 extends along a width direction of the second reinforcing member 3A12. The bearing 3A15 has a concave shape and is formed on an end surface of the one end T11 of the first reinforcing member 3A11. The shaft 3A14 is inserted into the bearing 3A15. Accordingly, the first reinforcing member 3A11 and the second reinforcing member 3A12 are rotatable (swingable) around the bearing 3A15 (shaft 3A14). Consequently, the other end T12 of the first reinforcing member 3A11 and the other end T22 of the second reinforcing member 3A12 are contactable/separable along a circumference of the center of the annular reinforcing body 3A1.

Figure 4:
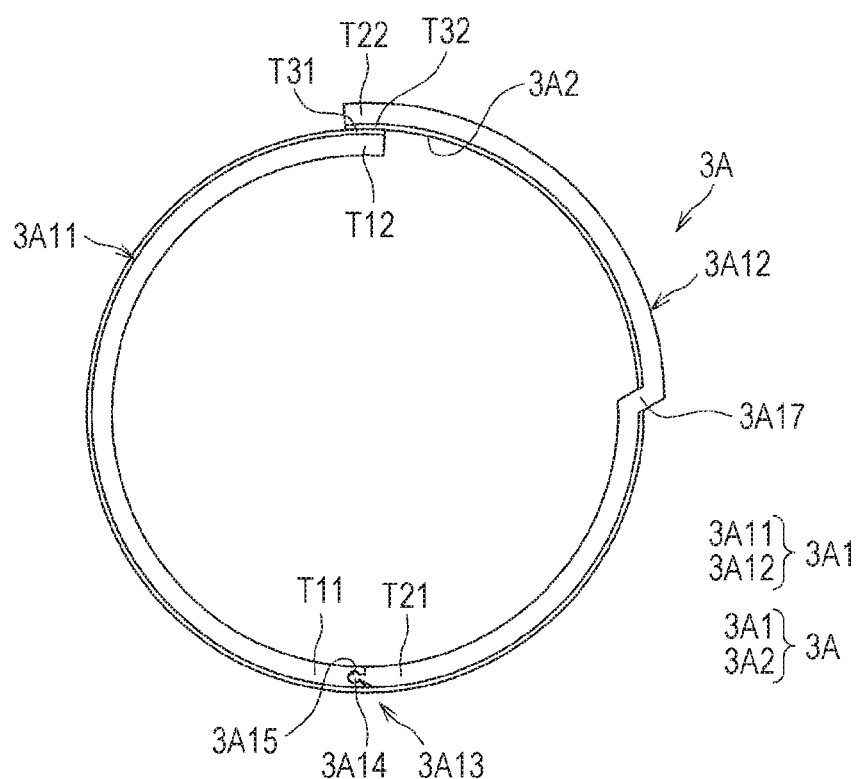
FIG. 4 is a side view of the excitation core illustrated in FIG. 3.

The other end T12 of the first reinforcing member 3A11 and the other end T22 of the second reinforcing member 3A12 correspond to both ends of the reinforcing body 3A1. When the other end T12 and the other end T22 are caused to be close to one another, the other end T12 and the other end T22 are overlapped in the thickness direction as illustrated in FIG. 4. In the present embodiment, an inner surface of the other end T22 of the second reinforcing member 3A12 is overlapped on an outer surface of the other end T12 of the first reinforcing member 3A 11. Hereinafter, a state of the annular excitation core 3A in which the other end T12 of the first reinforcing member 3A11 and the other end T22 of the second reinforcing member 3A12 are overlapped with one another in the thickness direction is referred to as "clamping (clamped state)" or "closing (closed state)". A state of the excitation core 3A in which the other end T12 of the first reinforcing member 3A11 and the other end T22 of the second reinforcing member 3A12 are separated is referred to as "non-clamping (non-clamped state)" or "opening (opened state)".

A stepped portion 3A17 is disposed in the middle of the second reinforcing member 3A12. In addition, the other end T22 side of the second reinforcing member 3A12 from the stepped portion 3A17 is disposed to project annularly outward from the first reinforcing member 3A11 and the one end T21 side of the second reinforcing member 3A12 from the stepped portion 3A17. That is, the first reinforcing member 3A11 and the one end T21 side of the second reinforcing member 3A12 from the stepped portion 3A17 are disposed along a circle having the same diameter. Meanwhile, the other end T22 side of the second reinforcing member 3A12 from the stepped portion 3A17 is disposed along a circle having a diameter larger than the diameter of the circle along which the first reinforcing member 3A11 and the one end T21 side of the second reinforcing member 3A12 from the stepped portion 3A17 are disposed.

In the present embodiment, the inner surface of the other end T22 side of the second reinforcing member 3A12 from the stepped portion 3A17, an outer surface of the first reinforcing member 3A 1, and an outer surface of the one end T21 side of the second reinforcing member 3A12 from the stepped portion 3A17 are disposed along a circle having the same diameter. In addition, a through-hole 3A16 penetrating the stepped portion 3A17 along the circumference of the center of the annular reinforcing body 3A1 is disposed in the stepped portion 3A17. The through-hole 3A16 is disposed to have a long rectangular shape along a width direction of the reinforcing body 3A1.

The strip-shaped magnetic substance 3A2 is made of a soft magnetic material. For example, the strip-shaped magnetic substance 3A2 has a thin strip shape (a ribbon shape) with a thickness of 100 μm or less and have flexibility. The strip-shaped magnetic substance 3A2 is disposed between the both ends of the reinforcing body 3A1. The strip-shaped magnetic substance 3A2 is disposed to be laid along or be pasted to an inner surface of the second reinforcing member 3A12 on the other end T22 side from the stepped portion 3A17, the outer surface of the second reinforcing member 3A12 on the one end T21 side from the stepped portion 3A17, and the outer surface of the first reinforcing member 3A11 through the through-hole 3A16.

More specifically, the strip-shaped magnetic substance 3A2 is caused to pass through the through-hole 3A16. One end T31 of the strip-shaped magnetic substance 3A2 is disposed on the outer surface of the other end T12 of the first reinforcing member 3A11. The other end T32 of the strip-shaped magnetic substance 3A2 is disposed on the inner surface of the other end T22 of the second reinforcing member 3A12. Accordingly, as illustrated in FIG. 4, when the both ends of the reinforcing body 3A1 (i.e., the other end T12 of the first reinforcing member 3A11 and the other end T22 of the second reinforcing member 3A12) are overlapped, the both ends of the strip-shaped magnetic substance 3A2 are also overlapped in the thickness direction and are in contact with one another.

Figure 7:
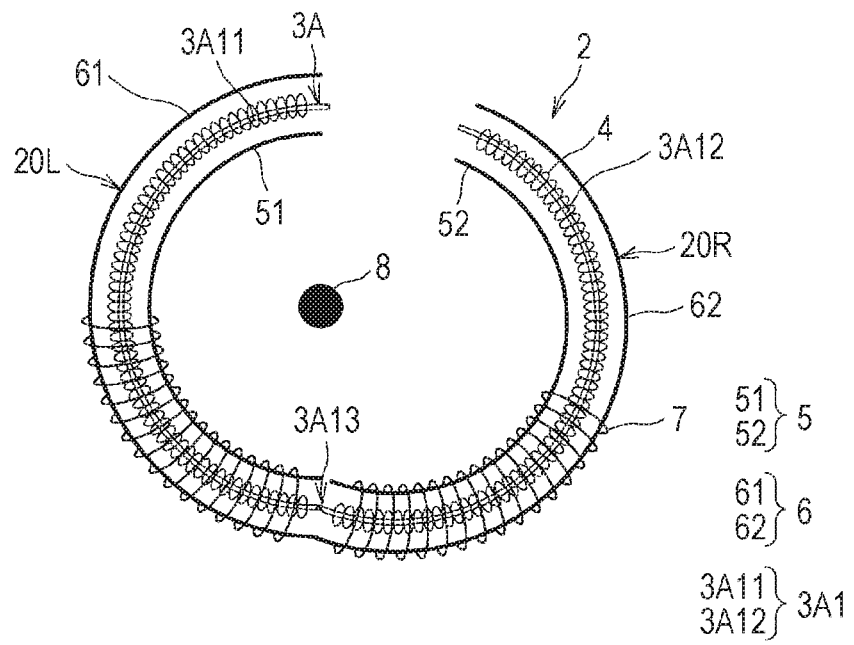
FIG. 7 is a schematic view of the sensor head illustrated in FIG. 1 during non-clamping.

As illustrated in FIG. 7, the inner magnetism collecting body 5 is divided into two and includes a first inner magnetism collector 51 as a first magnetism collector and a second inner magnetism collector 52 as a second magnetism collector. The first inner magnetism collector 51 and the second inner magnetism collector 52 have a strip plate shape (a strip shape). The first inner magnetism collector 51 and the second inner magnetism collector 52 are formed into a U shape such that both ends in the longitudinal direction are opposed in the thickness direction. Bringing both ends of the first inner magnetism collector 51 into contact with both ends of the second inner magnetism collector 52 forms the inner magnetism collecting body 5 into an annular shape (a circular shape).

The outer magnetism collecting body 6 is divided into two and includes a first outer magnetism collector 61 as a first magnetism collector and a second outer magnetism collector 62 as a second magnetism collector. The first outer magnetism collector 61 and the second outer magnetism collector 62 have a strip plate shape (a strip shape). The first outer magnetism collector 61 and the second outer magnetism collector 62 are formed into a U shape such that both ends in the longitudinal direction are opposed. Bringing both ends of the first outer magnetism collector 61 into contact with both ends of the second outer magnetism collector 62 forms the outer magnetism collecting body 6 into the annular shape (the circular shape).

The other end T12 of the first reinforcing member 3A11, the other end T22 of the second reinforcing member 3A12, the both ends of the first inner magnetism collector 51, the both ends of the second inner magnetism collector 52, the both ends of the first outer magnetism collector 61, and the both ends of the second outer magnetism collector 62 described above may be formed into a straight line shape (a flat plate shape), instead of an arc shape.

Further, the first reinforcing member 3A11, the strip-shaped magnetic substance 3A2 on the first reinforcing member 3A11, the first inner magnetism collector 51, and the first outer magnetism collector 61 described above are included in the left core 20L. Meanwhile, the second reinforcing member 3A12, the strip-shaped magnetic substance 3A2 on the second reinforcing member 3A12, the second inner magnetism collector 52, and the second outer magnetism collector 62 are included in the right core 20R.

Figure 3:
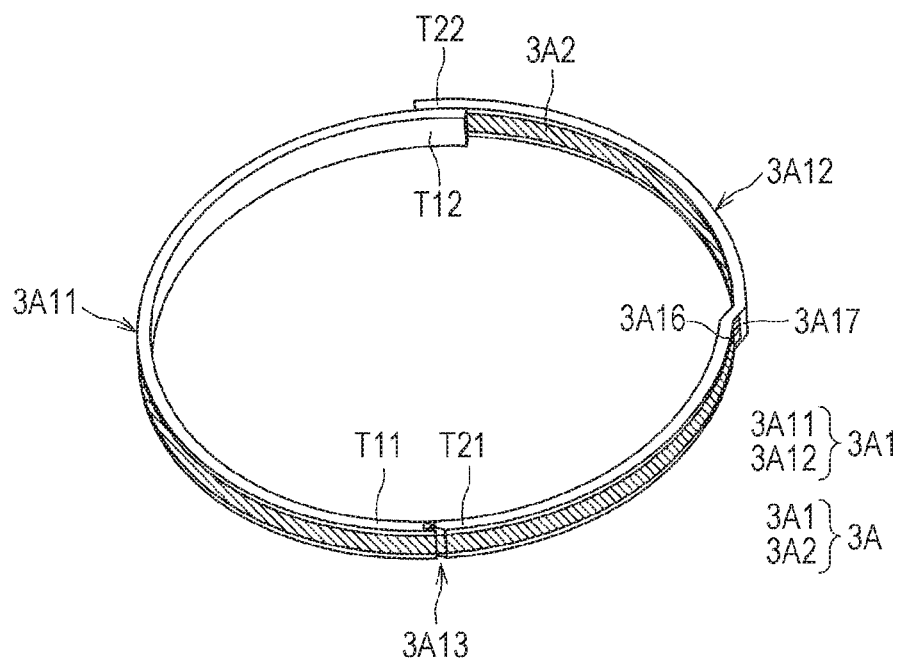
FIG. 3 is a perspective view of an excitation core illustrated in FIG. 1 during a clamping.
Figure 5:
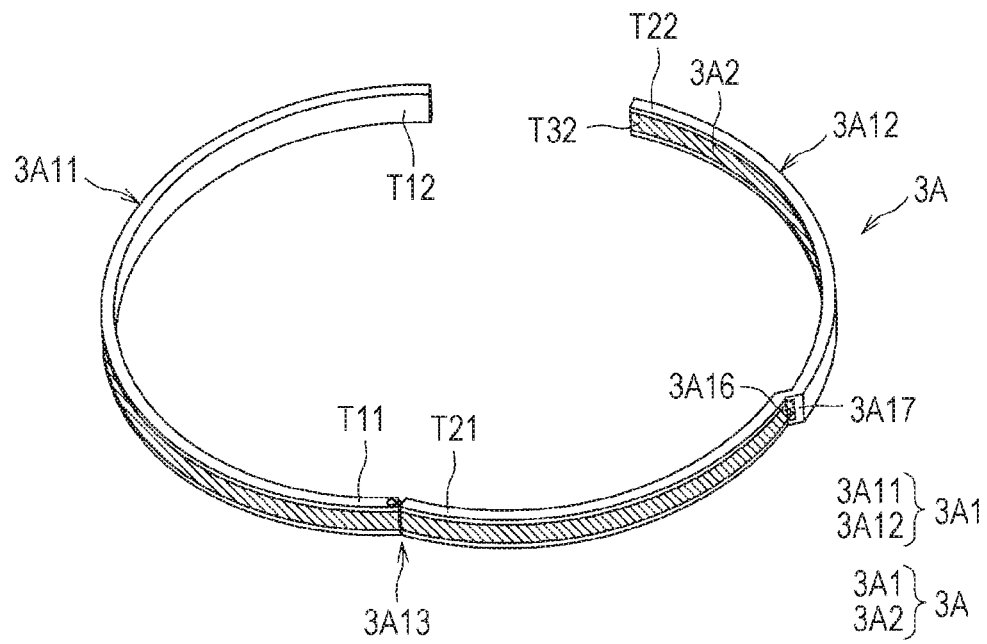
FIG. 5 is a perspective view of the excitation core illustrated in FIG. 1 during non-clamping.

With the above configuration, as illustrated in FIGS. 5 and 7, the first reinforcing member 3A11 and the second reinforcing member 3A12 are rotated around the shaft 3A14 so that the both ends of the reinforcing body 3A1 overlapped in the thickness direction are separated from one another. Accordingly, the both ends of the reinforcing body 3A1 are separated from one another, and both ends of the strip-shaped magnetic substance 3A2 disposed on the reinforcing body 3A1 are separated from one another. Consequently, the excitation core 3A is brought into the non-clamped state. At this time, as illustrated in FIG. 7, the both ends of the first inner magnetism collector 51, the both ends of the second inner magnetism collector 52, the both ends of the first outer magnetism collector 61, and the both ends of the second outer magnetism collector 62 are separated from one another so as to allow the above-described movement of the reinforcing body 3A1. Thereafter, the measurement target 8 is caused to pass through a gap between the separated both ends of the reinforcing body 3A1. Thereafter, when the first reinforcing member 3A11 and the second reinforcing member 3A12 are rotated around the shaft 3A14 so as to cause the both ends of the reinforcing body 3A1 to be close to one another, the both ends of the reinforcing body 3A1 and the both ends of the strip-shaped magnetic substance 3A2 are overlapped with one another in the thickness direction as illustrated in FIGS. 3 and 4. Consequently, the excitation core 3A is brought into the clamped state.

At this time, as illustrated in FIG. 1, the both ends of the first inner magnetism collector 51, the both ends of the second inner magnetism collector 52, the both ends of the first outer magnetism collector 61, and the both ends of the second outer magnetism collector 62 are also caused to be close to one another.

With the above-described first embodiment, the both ends of the strip-shaped magnetic substance 3A2 are overlapped in the thickness direction and are in contact with one another. Accordingly, regarding the opening and closing operations of the strip-shaped magnetic substance 3A2, the sufficient contacted areas can be maintained. In view of this, as the clamp-type excitation core 3A, the thin strip-shaped magnetic substance 3A2 is applicable. Further, the strip-shaped magnetic substance 3A2 is brought into contact at a single position. In view of this, by achieving a favorable contact only at the single position, a sensor property can be easily maintained.

With the first embodiment, the both ends of the strip-shaped magnetic substance 3A2 are overlapped in the thickness direction and are in contact with one another to form the annular strip-shaped magnetic substance. Further, the both ends of the strip-shaped magnetic substance 3A2 are disposed on the contactable/separable reinforcing body 3A1. Accordingly, even the flexible strip-shaped magnetic substance 3A2 can maintain its own shape. Therefore, mechanical strength can be increased without affecting the properties of the excitation core 3A.

With the first embodiment, the strip-shaped magnetic substance 3A2 is caused to pass through the through-hole 3A16. The one end T31 of the strip-shaped magnetic substance 3A2 is positioned on the outer surface of the other end T12 of the first reinforcing member 3A11 (=one end of the reinforcing body 3A1). The other end T32 of the strip-shaped magnetic substance 3A2 is positioned on the inner surface of the other end T22 of the second reinforcing member 3A12 (=the other end of reinforcing body 3A1). As described above, when the through-hole 3A16 is disposed in the reinforcing body 3A1, it is possible to easily support the strip-shaped magnetic substance 3A2 so that the both ends of the strip-shaped magnetic substance 3A2 are overlapped in the thickness direction.

With the first embodiment, the stepped portion 3A17 is disposed in the reinforcing body 3A1. Further, the other end T22 side of the second reinforcing member 3A12 from the stepped portion 3A17 is disposed to project annularly outward from the first reinforcing member 3A11 and the one end T21 side of the second reinforcing member 3A12 from the stepped portion 3A17. That is, the other end side of the reinforcing body 3A1 from the stepped portion 3A17 projects annularly outward from the one end side of the reinforcing body 3A1 from the stepped portion 3A17. Further, the through-hole 3A16 is formed in the stepped portion 3A17. Accordingly, it is possible to restrain the strip-shaped magnetic substance 3A2 caused to pass through the through-hole 3A16 from being deformed. Consequently, it is possible to improve the properties of the excitation core 3A.

The inner surface of the other end T22 side of the second reinforcing member 3A12 from the stepped portion 3A17, the outer surface of the first reinforcing member 3A11, and the outer surface of the one end T21 side of the second reinforcing member 3A12 from the stepped portion 3A17 are disposed along a circle having the same diameter. Accordingly, the strip-shaped magnetic substance 3A2 caused to pass through the through-hole 3A16 can maintain a circular shape.

With the first embodiment, the reinforcing body 3A1 includes the first reinforcing member 3A11 and the second reinforcing member 3A12 as separate components. The hinge 3A13 is disposed in the one end T11 of the first reinforcing member 3A11 and the one end T21 of the second reinforcing member 3A12. Accordingly, the first reinforcing member 3A1 and the second reinforcing member 3A12 are attached to one another so as to be swingable around the shaft 3A14 (bearing 3A15). Further, the other end T12 of the first reinforcing member 3A11 and the other end T22 of the second reinforcing member 3A12 are overlapped with one another in the thickness direction. Accordingly, the reinforcing body 3A1 of a simple configuration can hold the strip-shaped magnetic substance 3A2 and open and close the both ends of the strip-shaped magnetic substance 3A2.

Figure 8:
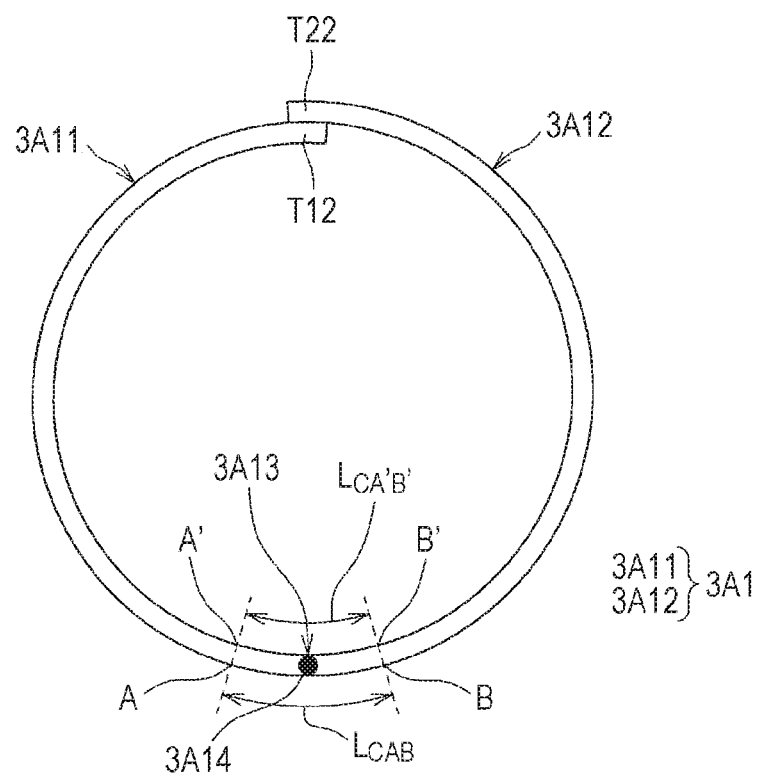
FIG. 8 is a schematic side view of a reinforcing body illustrated in FIG. 1 during a clamping.
Figure 9:
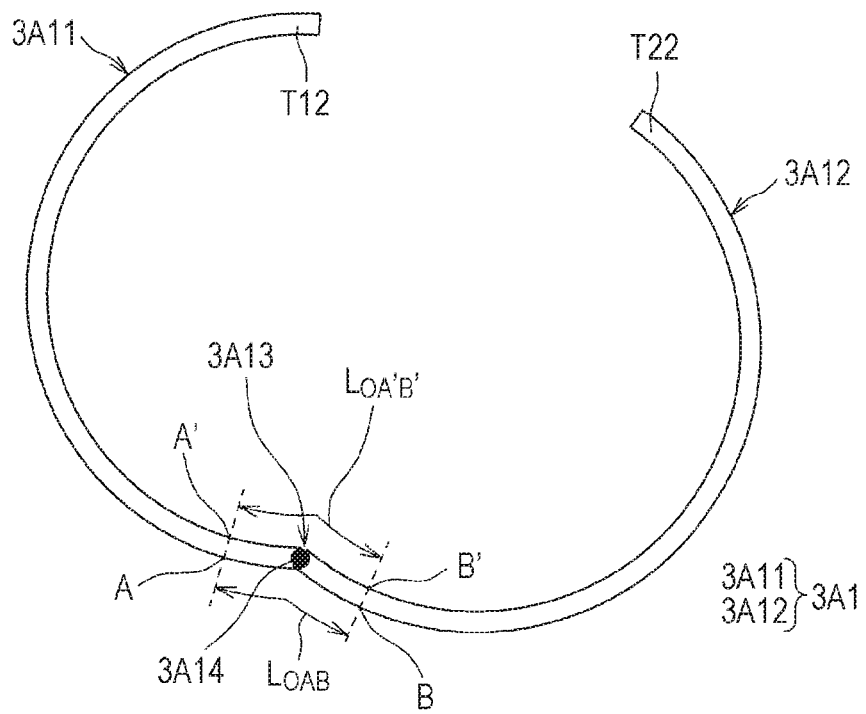
FIG. 9 is a schematic side view of the reinforcing body illustrated in FIG. 1 during non-clamping.

As illustrated in FIGS. 8 and 9, in the above-described first embodiment, two points on the outer surfaces of the first reinforcing member 3A11 and the second reinforcing member 3A12, between which the shaft 3A14 is positioned, are denoted by A and B, and, similarly, two points on the inner surfaces thereof are denoted by A' and B'. In addition, a distance between the two points A and B during a clamping is denoted by $L_{CAB}$, and a distance between the two points A' and B' during a clamping is denoted by $L_{CA'B'}$ (see FIG. 8). Further, a distance between the two points A and B during non-clamping is denoted by $L_{OAB}$, and a distance between the two points A' and B' during non-clamping is denoted by $L_{OA'B'}$. Those distances satisfy the following inequalities (1) and (2).

$$L_{CAB} > L_{OAB} \quad (1)$$

$$L_{CA'B'} < L_{OA'B'} \quad (2)$$

Figure 10:
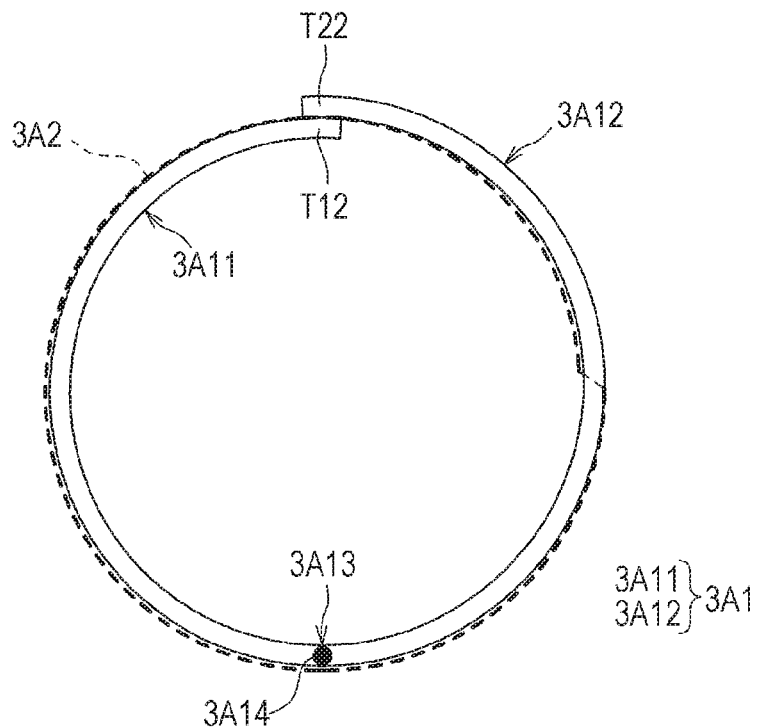
FIG. 10 is a schematic side view of the excitation core illustrated in FIG. 1 during a clamping.
Figure 11:
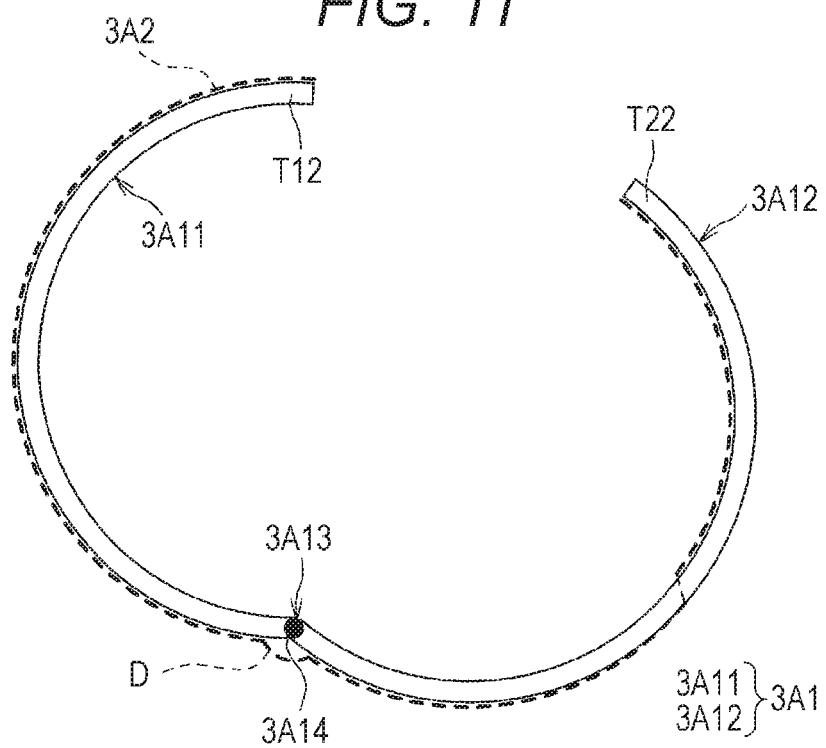
FIG. 11 is a schematic side view of the excitation core illustrated in FIG. 1 during non-clamping.

That is, when the strip-shaped magnetic substance 3A2 is disposed on an outer surface of the hinge 3A13 and the shaft 3A14 is disposed between an inner surface and an outer surface of the reinforcing body 3A1, the above-described expressions (1) and (2) are satisfied. Accordingly, as illustrated in FIG. 11, a deformed portion (bending) D that does not extends along the reinforcing body 3A1 is generated in the strip-shaped magnetic substance 3A2 during non-clamping. However, as illustrated in FIG. 10, the strip-shaped magnetic substance 3A2 is disposed along the reinforcing body 3A1 during a clamping, and therefore no deformed portion (bending) D is generated. Accordingly, the strip-shaped magnetic substance 3A2 can be symmetrical during a clamping. Therefore, during a clamping, the strip-shaped magnetic substance 3A2 does not easily affected by a positional shift of the measurement target 8 from the center of the strip-shaped magnetic substance 3A2 or an external magnetic field. Consequently, it is possible to improve the sensor property. The stepped portion 3A17 is omitted in FIGS. 8 to 11 described above and FIGS. 12 to 17 described below in order to simplify the description.

In the above-described embodiment, the stepped portion 3A17 is disposed in the reinforcing body 3A1 (e.g., the second reinforcing member 3A12). However, the stepped portion 3A17 is not necessarily disposed. The through-hole 3A16 along a diameter direction may be disposed in the reinforcing body 3A1 (e.g., the second reinforcing member 3A12).

Figure 12:
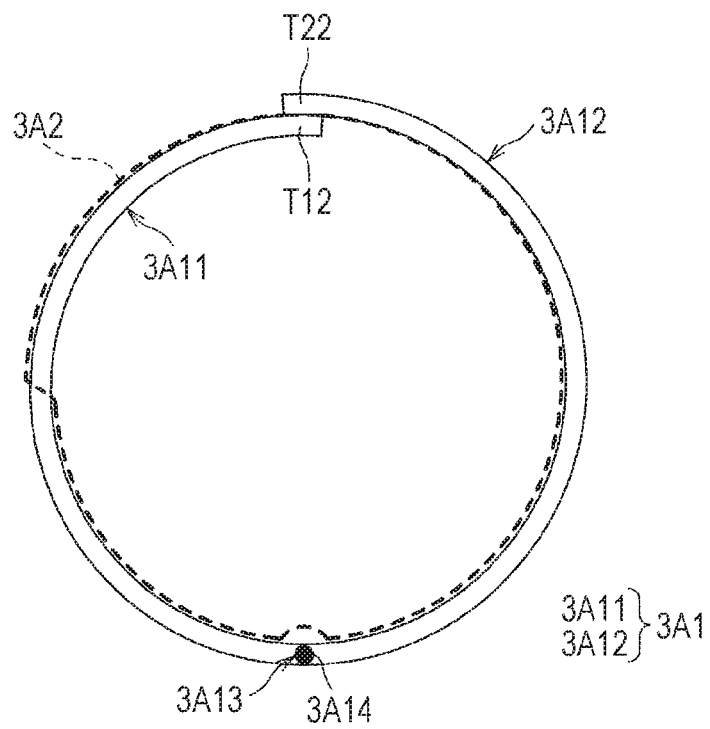
FIG. 12 is a schematic side view illustrating an excitation core in a modification example during a clamping.
Figure 13:
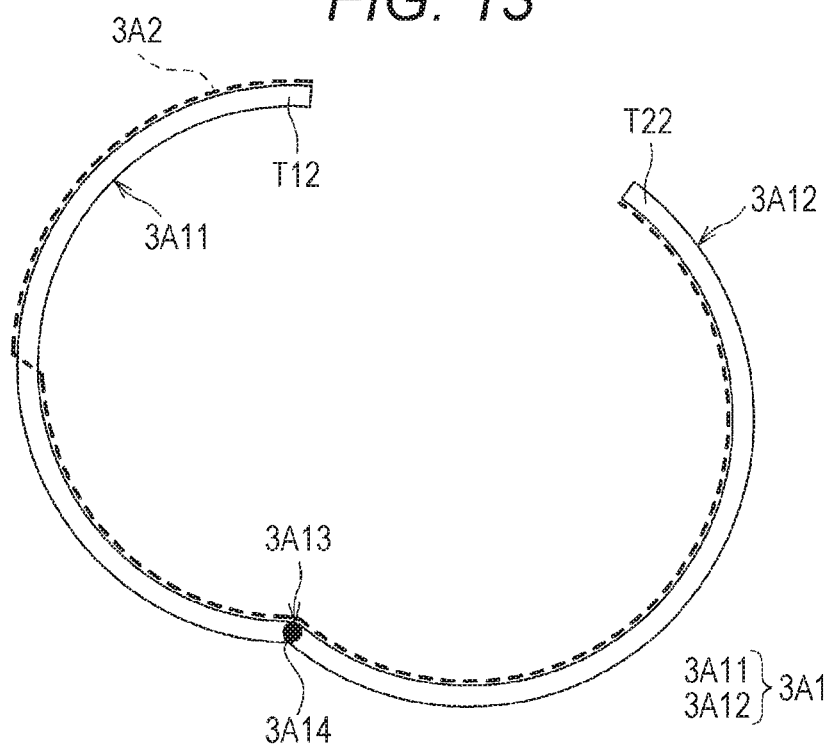
FIG. 13 is a schematic side view illustrating an excitation core in a modification example during non-clamping.

In the above-described embodiment, the strip-shaped magnetic substance 3A2 is disposed on the outer surface of the hinge 3A13. Instead of this, as illustrated in FIGS. 12 and 13, the strip-shaped magnetic substance 3A2 may be disposed on an inner surface of the hinge 3A13. In this case, the through-hole 3A16 is disposed in the first reinforcing member 3A11.

Figure 14:
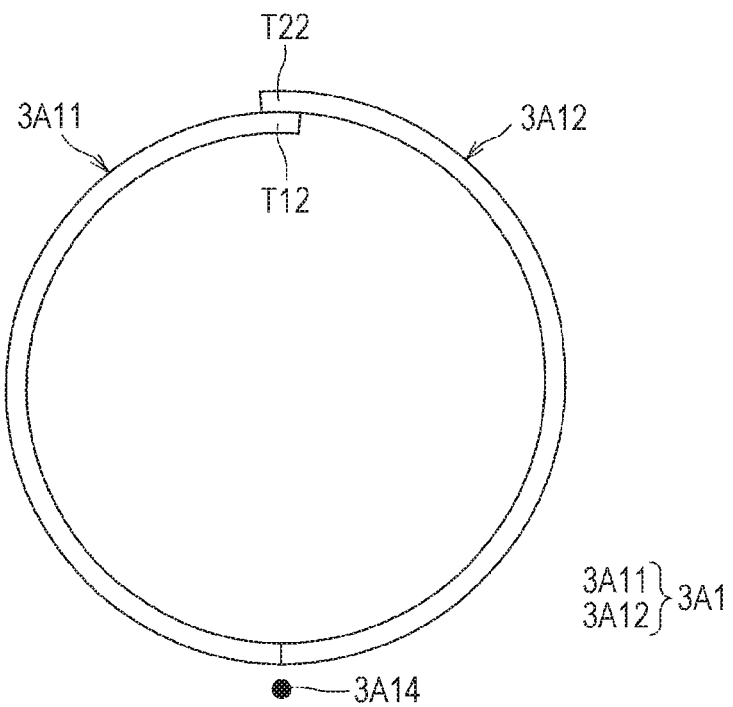
FIG. 14 is a schematic side view illustrating a reinforcing body in a modification example during a clamping.
Figure 15:
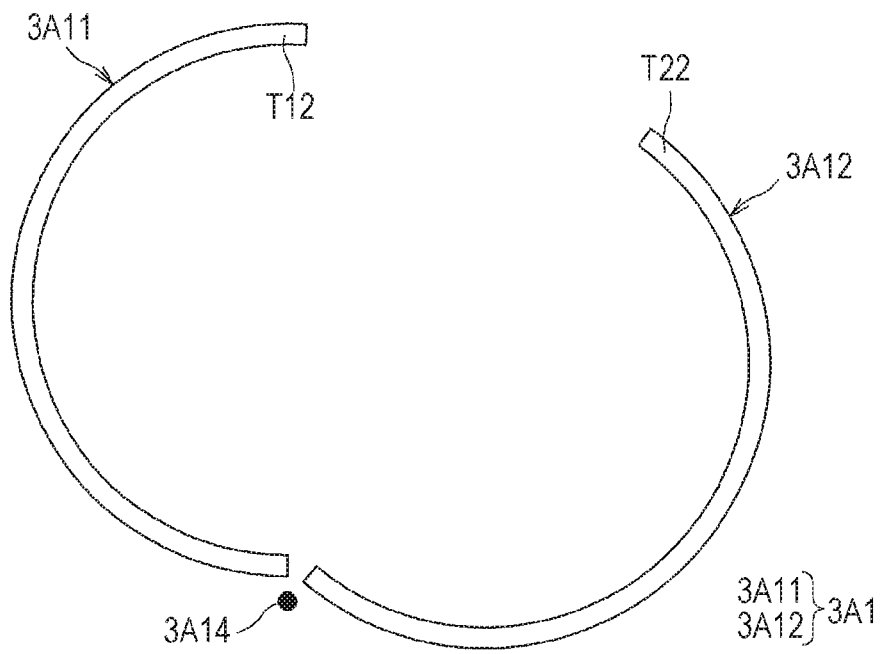
FIG. 15 is a schematic side view illustrating a reinforcing body in a modification example during non-clamping.

In the above-described embodiment, the shaft 3A14 is disposed between the inner surface and the outer surface of the reinforcing body 3A1. Instead of this, as illustrated in FIGS. 14 and 15, the shaft 3A14 may be disposed on an outside of the outer surface of the reinforcing body 3A1.

Figure 16:
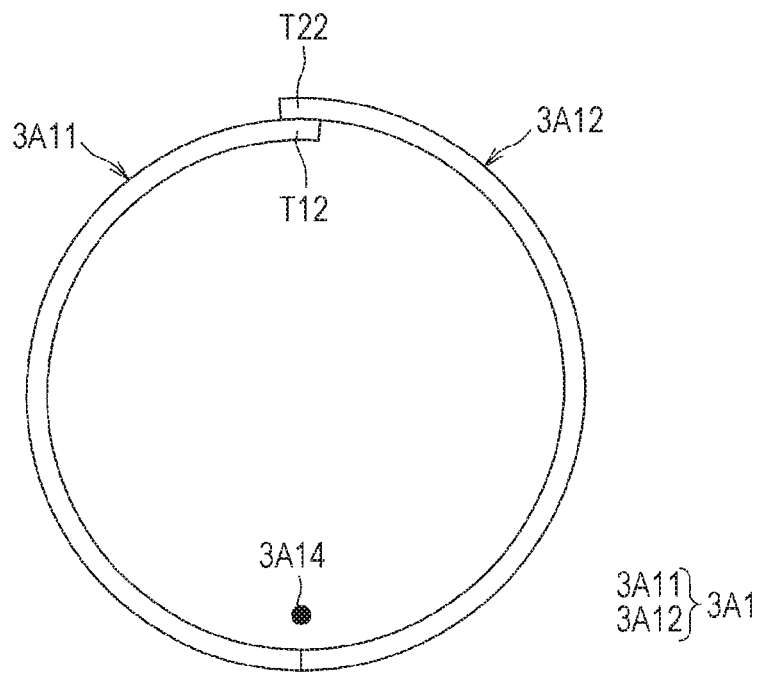
FIG. 16 is a schematic side view illustrating a reinforcing body in a modification example during a clamping.
Figure 17:
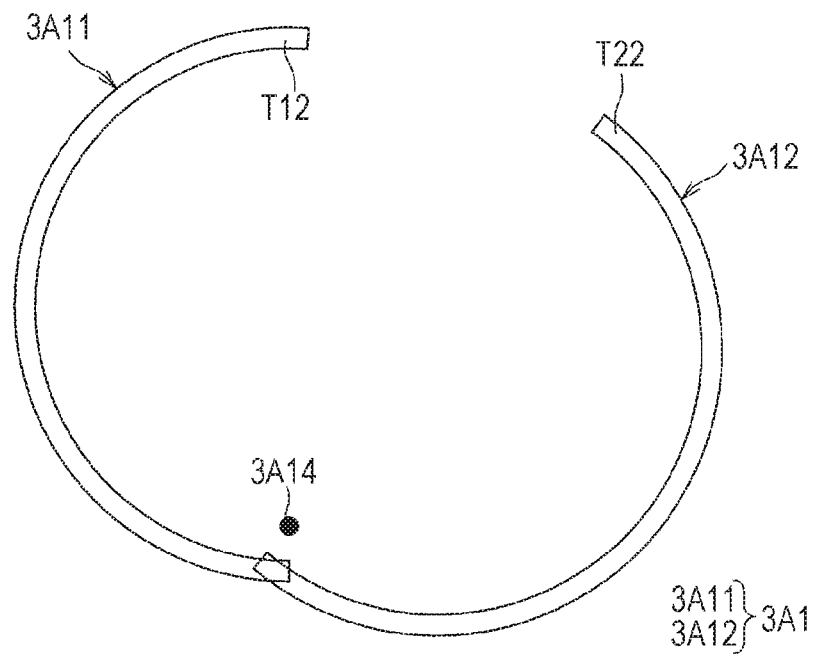
FIG. 17 is a schematic side view illustrating a reinforcing body in a modification example during non-clamping.

As illustrated in FIGS. 16 and 17, the shaft 3A14 may be disposed on an inside of the inner surface of the reinforcing body 3A1. In this case, the distances $L_{CAB}$, $L_{CA'B'}$, $L_{OAB}$, and $L_{OA'B'}$ satisfy the following inequalities (3) and (4).

$$L_{CAB} > L_{OAB} \quad (3)$$

$$L_{CA'B'} > L_{OA'B'} \quad (4)$$

In this case, a deformed portion D is generated during non-clamping and no deformed portion D is generated during a clamping, regardless of whether the strip-shaped magnetic substance 3A2 is disposed on the outer surfaces or the inner surfaces of the one end T11 of the first reinforcing member 3A11 and the one end T21 of the second reinforcing member 3A12.

In the above-described first embodiment, the reinforcing body 3A1 includes two members, i.e., the first reinforcing member 3A11 and the second reinforcing member 3A12, and the both ends of the reinforcing body 3A1 are contactable/separable by the hinge 3A13. However, such a configuration is not necessarily provided. When the reinforcing body 3A1 is made of a material having a certain degree of elasticity, the both ends of the reinforcing body 3A1 can be contactable/separable even in a case where the hinge 3A13 is not provided. Further, when a part of the reinforcing body 3A1 is thinned to be deformable, the both ends of the reinforcing body 3A1 can be contactable/separable even in a case where the hinge 3A13 is not provided.

In the above-described first embodiment, an example where a single excitation core 3A is disposed has been described. However, the number of excitation cores 3A is not limited thereto. A plurality of excitation cores 3A may be disposed in a width direction of a strip, and the measurement target 8 may be caused to pass through the center of the plurality of excitation cores 3A. In this case, the wave detection circuit 12 adds an exciting voltage or exciting current of the excitation coil 4 wound around each excitation core 3A and generates a signal based on a result of addition. Passing this signal through the LPF circuit 13 obtains the signal proportional to the measured current.

Second Embodiment

Figure 18:
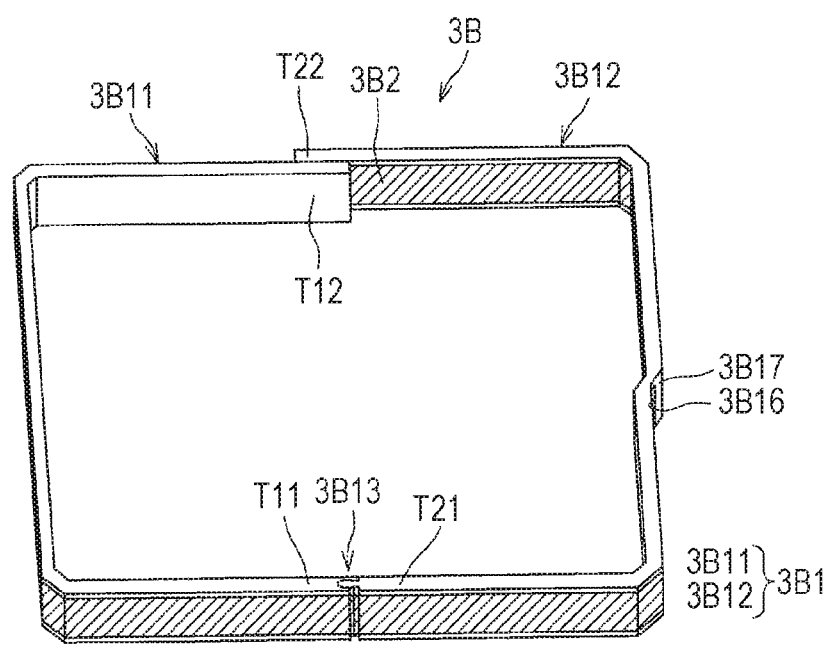
FIG. 18 is a perspective view of an excitation core in a second embodiment during a clamping.
Figure 19:
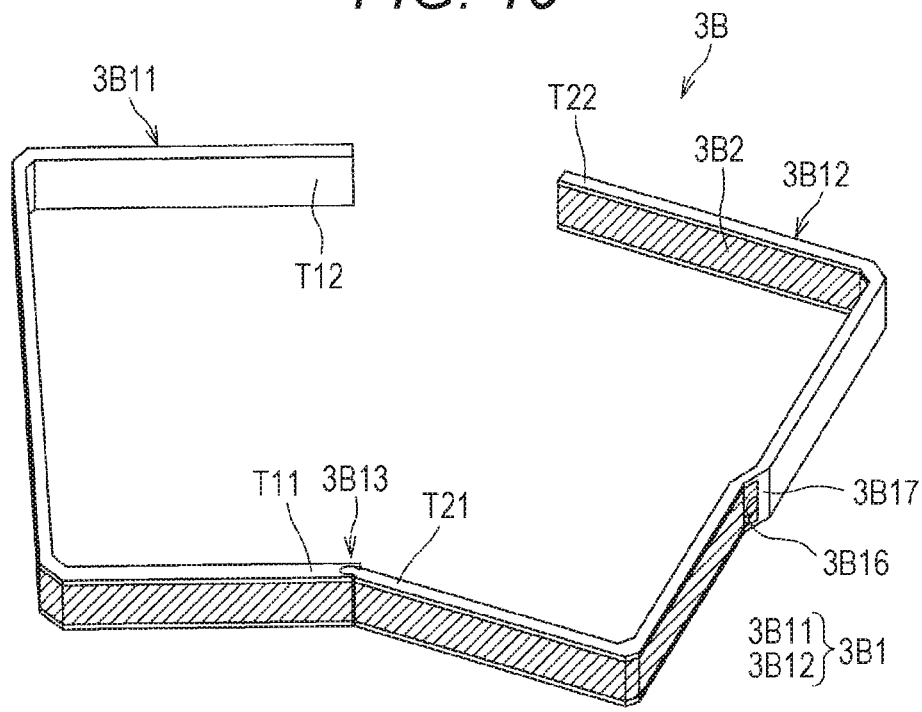
FIG. 19 is a perspective view of an excitation core illustrated in FIG. 18 during non-clamping.
Figure 20:
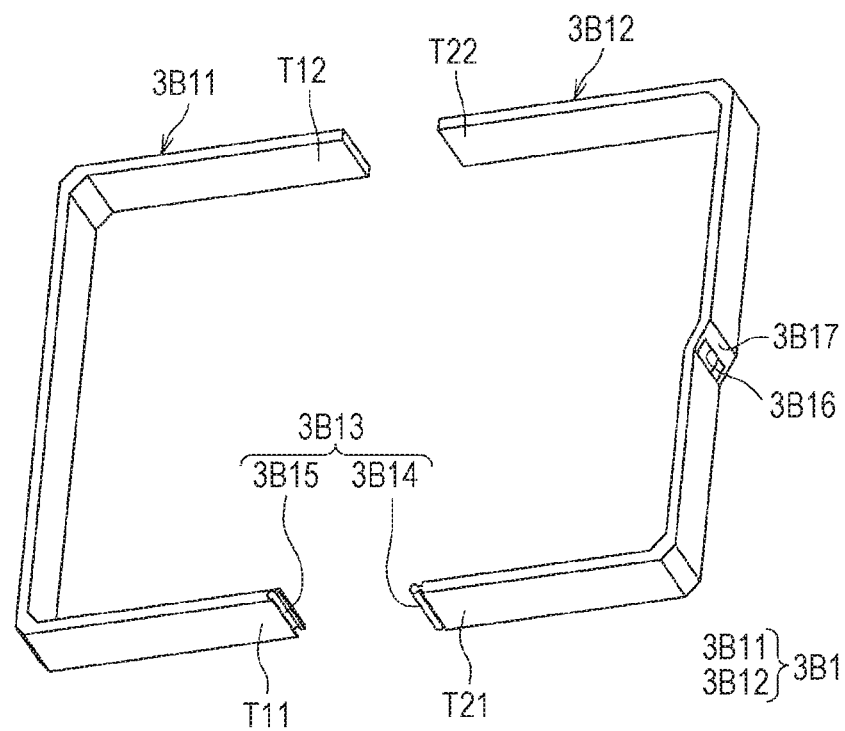
FIG. 20 is an exploded perspective view of the reinforcing body illustrated in FIG. 18.

The following describes the contactless type current sensor 1 in the second embodiment with reference to FIGS. 18 to 20. The difference between the first embodiment and the second embodiment is a configuration of an excitation core 3B. The parts other than the excitation core 3B are similar to the first embodiment and therefore will not be further elaborated here.

The excitation core 3B includes a reinforcing body 3B1 and a strip-shaped magnetic substance 3B2. The reinforcing body 3B1 is made of a strip-shaped non-magnetic material (such as plastic). Overlapping both ends of the reinforcing body 3B1 in a thickness direction and bringing the both ends thereof into contact with one another forms a rectangular annular reinforcing body 3B1. The reinforcing body 3B1 includes a first reinforcing member 3B11 and a second reinforcing member 3B12. The first reinforcing member 3B11 and the second reinforcing member 3B12 are made of a non-magnetic material (such as plastic) and have a substantially U shape. A hinge 3B13 is disposed in one end T11 of the first reinforcing member 3B11 and the one end T21 of the second reinforcing member 3B12 (a connection portion between the one end T11 and the one end T21). The hinge 3B13, as well as the hinge 3A13 in the first embodiment, includes a shaft 3B14 and a bearing 3B15. Further, a stepped portion 3B17, as well as the stepped portion 3A17 in the first embodiment, is disposed in the second reinforcing member 3B12. A through-hole 3B 16 is formed in this stepped portion 3B17 to allow the strip-shaped magnetic substance 3B2 to pass therethrough. As described above, the reinforcing body 3B1 and the strip-shaped magnetic substance 3B2 may be formed into a rectangular annular shape.

Third Embodiment

Figure 21:
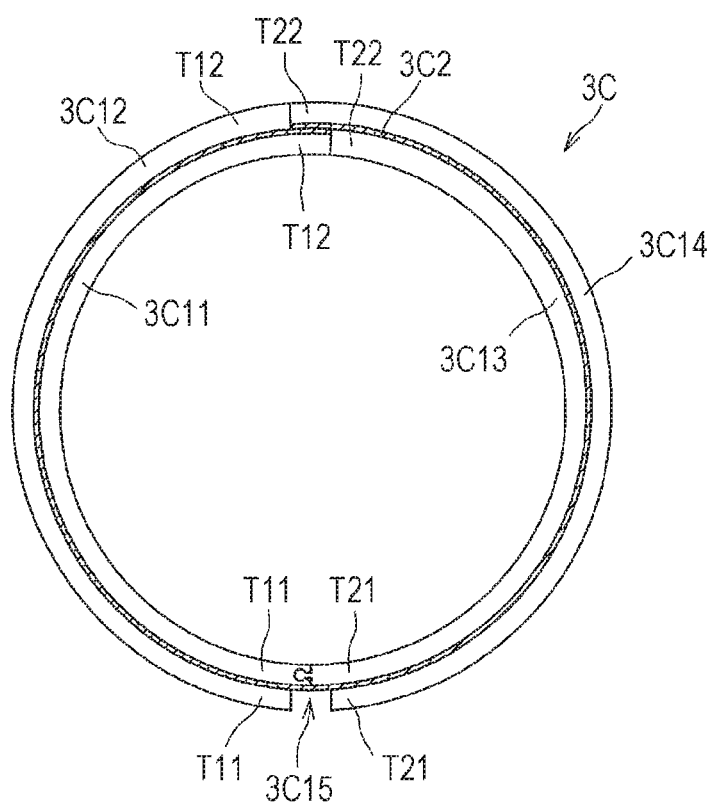
FIG. 21 is a side view of an excitation core in a third embodiment during a clamping.

The following describes the contactless type current sensor 1 in the third embodiment with reference to FIG. 21. The difference between the first embodiment and the third embodiment is a configuration of an excitation core 3C. The parts other than the excitation core 3C are similar to the first embodiment and therefore will not be further elaborated here.

In the first embodiment, the through-hole 3A16 is disposed in the reinforcing body 3A1. On the contrary, the through-hole 3A16 is not disposed in a reinforcing body 3C1 illustrated in FIG. 21.

The excitation core 3C includes the reinforcing body 3C1 and a strip-shaped magnetic substance 3C2. The reinforcing body 3C 1 includes a first inner reinforcing member 3C 11, a first outer reinforcing member 3C 12, a second inner reinforcing member 3C13, and a second outer reinforcing member 3C14, each of which is made of a non-magnetic material (such as plastic) and has a substantially U shape. Each of the reinforcing members 3C 11 to 3C 14 is formed into a substantially U shape along a semicircle. A hinge 3C 15 is disposed in one end T11 of the first inner reinforcing member 3C 11 and one end T21 of the second inner reinforcing member 3C 13 (a connection portion between the one end T11 and the one end T21). The hinge 3C 15 is similar to the hinge 3A13 of the first embodiment and therefore will not be further elaborated here.

The strip-shaped magnetic substance 3C2 is disposed on outer surfaces of the above-described first inner reinforcing member 3C 11 and the above-described second inner reinforcing member 3C 13. The first outer reinforcing member 3C 12 holds the strip-shaped magnetic substance 3C2 so that the strip-shaped magnetic substance 3C2 is inserted between the first outer reinforcing member 3C 12 and the first inner reinforcing member 3C11. The other end T12 of the first outer reinforcing member 3C 12 is disposed closer to the one end T11 of the first inner reinforcing member 3C 11 than to the other end T12 of the first inner reinforcing member 3C 11 is. Accordingly, an outer surface of the strip-shaped magnetic substance 3C2 positioned at the other end T12 of the first inner reinforcing member 3C 11 is exposed.

The second outer reinforcing member 3C 14 holds the strip-shaped magnetic substance 3C2 so that the strip-shaped magnetic substance 3C2 is inserted between the second outer reinforcing member 3C14 and the second inner reinforcing member 3C13. The other end T22 of the second outer reinforcing member 3C 14 is disposed to be closer to the other end T22 of the second inner reinforcing member 3C13 than to the one end T21 of the second inner reinforcing member 3C13. That is, the other end T22 of the second outer reinforcing member 3C14 is disposed beyond the other end T22 of the second inner reinforcing member 3C13. Accordingly, an inner surface of the strip-shaped magnetic substance 3C2 positioned at the other end T22 of the second outer reinforcing member 3C 14 is exposed. Consequently, the outer surface of the strip-shaped magnetic substance 3C2 positioned at the other end T12 of the first inner reinforcing member 3C 11 and the inner surface of the strip-shaped magnetic substance 3C2 positioned at the other end T22 of the second outer reinforcing member 3C 14 can be overlapped with one another.

With the above configuration, even in a case where the through-hole is not disposed, both ends of the strip-shaped magnetic substance 3C2 can be close to one another to be overlapped in the thickness direction and can be separated from one another by rotating the reinforcing members 3C 11 to 3C14 around the hinge 3C15.

The technique of the present disclosure is not limited to the above-described embodiments. That is, the above-described embodiments can be modified in various ways without departing from the gist of the technique of the disclosure.

The embodiments of the present disclosure may be the following first to seventh excitation cores, first sensor head, and first current sensor.

A first excitation core includes a strip-shaped magnetic substance, both ends of the strip-shaped magnetic substance being brought into contact with one another to form an annular excitation core, in which the both ends of the strip-shaped magnetic substance are overlapped in a thickness direction and are in contact with one another.

A second excitation core according to the first excitation core further includes an annular reinforcing body made of a non-magnetic material and having both ends overlapped in the thickness direction and in contact with one another, in which: the both ends of the reinforcing body are disposed to be contactable/separable; and the strip-shaped magnetic substance is disposed on the reinforcing body.

A third excitation core is an excitation core according to the second excitation core, in which: a through-hole is formed in the reinforcing body; and the strip-shaped magnetic substance is caused to pass through the through-hole, and one end thereof is disposed on an outer surface of one end of the reinforcing body and the other end thereof is disposed on an inner surface of the other end of the reinforcing body.

A fourth excitation core is an excitation core according to the third excitation core, in which: a stepped portion is disposed in the reinforcing body; the other end side from the stepped portion is disposed to project annularly outward from the one end side from the stepped portion; and the through-hole is formed in the stepped portion.

A fifth excitation core is an excitation core according to any one of the second to fourth excitation cores, in which: the reinforcing body includes a first reinforcing member and a second reinforcing member as separate components; a hinge is disposed in one end of the first reinforcing member and one end of the second reinforcing member and is attached to be swingable around a shaft; and the other end of the first reinforcing member and the other end of the second reinforcing member are overlapped in the thickness direction.

A sixth excitation core is an excitation core according to the fifth excitation core, in which the strip-shaped magnetic substance is disposed on an outside of the hinge.

A seventh excitation core is an excitation core according to the fifth or sixth excitation core, in which the shaft is disposed between an outer surface and an inner surface of the reinforcing body.

A first sensor head includes: one of the first to seventh excitation cores; and a magnetism collecting body including a strip-shaped first magnetism collector and a strip-shaped first second magnetism collector, the first magnetism collector having both ends thereof in contact with both ends of the second magnetism collector to form the annular magnetism collecting body, the magnetism collecting body being disposed on an inside or an outside of the reinforcing body.

A first current sensor includes: one of the first to seventh excitation cores; and a current detector configured to detect a current flowing through a measurement target penetrating the excitation core.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An excitation core, comprising:
an annular strip-shaped magnetic substance, wherein both ends of the strip-shaped magnetic substance are overlappable in a thickness direction and are contactable with one another; and
an annular reinforcing body made of a non-magnetic material, said annular reinforcing body having a first side and a second side opposite to said first side, and having both ends overlappable in the thickness direction,
wherein:
the both ends of the annular reinforcing body are contactable/separable or moveable to permit the reinforcing body to be openable/closeable; and
the strip-shaped magnetic substance is disposed on a portion of the first side of the reinforcing body and is disposed on a portion of the second side of the reinforcing body.

2. An excitation core, comprising:
an annular strip-shaped magnetic substance, wherein both ends of the strip-shaped magnetic substance are overlappable in a thickness direction and are contactable with one another; and
an annular reinforcing body made of a non-magnetic material and having both ends overlappable in the thickness direction,
wherein:
the both ends of the annular reinforcing body are moveable to permit the annular reinforcing body to be openable/closeable;
the strip-shaped magnetic substance is disposed on the annular reinforcing body;
the annular reinforcing body has a through-hole; and
the strip-shaped magnetic substance is caused to pass through the through-hole, and one end of the strip-shaped magnetic substance is positioned on an outer surface of one end of the annular reinforcing body and the other end of the strip-shaped magnetic substance is positioned on an inner surface of the other end of the annular reinforcing body.

3. The excitation core according to claim 2, wherein:
the annular reinforcing body has a stepped portion;
the other end side of the annular reinforcing body from the stepped portion projects annularly outward from the one end side of the annular reinforcing body from the stepped portion; and
the through-hole is formed in the stepped portion.

4. An excitation core, comprising:
an annular strip-shaped magnetic substance, wherein both ends of the strip-shaped magnetic substance are overlappable in a thickness direction and are contactable with one another; and
an annular reinforcing body made of a non-magnetic material and having both ends overlappable in the thickness direction,
wherein:
the both ends of the annular reinforcing body are moveable to permit the annular reinforcing body to be openable/closeable;
the strip-shaped magnetic substance is disposed on the reinforcing body;
the annular reinforcing body includes a first reinforcing member and a second reinforcing member as separate components;
a hinge including a shaft and allowing the first reinforcing member and the second reinforcing member to be swingable around the shaft is disposed in one end of the first reinforcing member and one end of the second reinforcing member; and
the other end of the first reinforcing member and the other end of the second reinforcing member are overlappable in the thickness direction.

5. The excitation core according to claim 4, wherein the annular strip-shaped magnetic substance is disposed on an outside of the hinge.

6. The excitation core according to claim 4, wherein the shaft of the hinge is disposed between an outer surface and an inner surface of the annular reinforcing body.

7. A sensor head, comprising:
the excitation core according to claim 1; and
a magnetism collecting body including a strip-shaped first magnetism collector and a strip-shaped second magnetism collector, the first magnetism collector having both ends thereof in contact with both ends of the second magnetism collector to form the annular magnetism collecting body, the annular magnetism collecting body being disposed on an inside or an outside of the annular reinforcing body.

8. A current sensor, comprising:
the excitation core according to claim 1; and
a current detector configured to detect a current flowing through a measurement target penetrating the excitation core.

9. The excitation core according to claim 1, wherein said first side is facing outward of said annular reinforcing body and said second side is facing inward of said annular reinforcing body.

10. The excitation core according to claim 9, wherein the magnetic strip on said portion of the first side of the annular reinforcing body is longer than the magnetic strip on said portion of the second side of the annular reinforcing body.

11. The excitation core according to claim 1, wherein the annular reinforcing body includes a pair of first and second reinforcing members respectively swingable around a shaft of a hinge member disposed between one end of the first reinforcing member along a longitudinal direction of the first reinforcing member and one end of the second reinforcing member along a longitudinal direction of the second reinforcing member, and wherein the following inequalities are satisfied:

$$L_{CAB} > L_{OAB} \quad (1)$$

$$L_{CA'B'} < L_{OA'B'} \quad (2)$$

where:

$L_{CAB}$; distance between two points A and B on outer surfaces of the first and the second reinforcing members at a clamping state, $L_{OAB}$; distance between the two points A and B on the outer surfaces of the first and the second reinforcing members at a non-clamping state, $L_{CA'B'}$; distance between two points A' and B' on inner surfaces of the first and the second reinforcing members at the clamping state, and $L_{OA'B'}$; distance between the two points A' and B' on the inner surfaces of the first and the second reinforcing members at the non-clamping state.

12. The excitation core according to claim 1, wherein both the first side and the second side of the annular reinforcing body are configured to be in contact with one another.

13. The excitation core according to claim 2, wherein both the first side and the second side of the annular reinforcing body are configured to be in contact with one another.

14. The excitation core according to claim 4, wherein both the first side and the second side of the annular reinforcing body are configured to be in contact with one another.

* * * * *